(12) United States Patent
Goodner et al.

(10) Patent No.: US 7,344,972 B2
(45) Date of Patent: Mar. 18, 2008

(54) PHOTOSENSITIVE DIELECTRIC LAYER

(75) Inventors: Michael D. Goodner, Hillsboro, OR (US); Kevin P. O'Brien, Portland, OR (US); Grant M. Kloster, Lake Oswego, OR (US); Robert P. Meagley, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 189 days.

(21) Appl. No.: 10/829,592

(22) Filed: Apr. 21, 2004

(65) Prior Publication Data
US 2005/0239281 A1    Oct. 27, 2005

(51) Int. Cl.
*H01L 21/4763* (2006.01)

(52) U.S. Cl. .............................. 438/619; 257/E21.579

(58) Field of Classification Search ........ 438/618–622, 438/694–699, 770–775, 752–760
See application file for complete search history.

(56) References Cited

U.S. PATENT DOCUMENTS

| | | | |
|---|---|---|---|
| 6,153,528 A * | 11/2000 | Lan .............................. | 439/697 |
| 6,165,890 A * | 12/2000 | Kohl et al. .................. | 438/619 |
| 6,252,290 B1 * | 6/2001 | Quek et al. .................. | 257/522 |
| 6,277,765 B1 * | 8/2001 | Cheng et al. ................ | 438/773 |
| 6,833,320 B2 | 12/2004 | Meagley et al. ............. | 438/640 |
| 2002/0158337 A1 | 10/2002 | Babich et al. ............... | 257/758 |
| 2002/0175417 A1 | 11/2002 | Morrow et al. ............. | 257/758 |
| 2004/0038513 A1 * | 2/2004 | Kohl et al. .................. | 438/619 |
| 2004/0130032 A1 * | 7/2004 | Gronbeck et al. .......... | 257/759 |
| 2004/0266167 A1 * | 12/2004 | Dubin et al. ................ | 438/619 |

FOREIGN PATENT DOCUMENTS

DE    102 38 024 A1    3/2004

OTHER PUBLICATIONS

Robert P. Meagley et al., "Photodefinable Polymers for Semiconductor Applications", U.S. Appl. No. 10/337,575, filed Jan. 6, 2003.
Robert P. Meagley et al., "Photodefinable Polymers for Semiconductor Applications", U.S. Appl. No. 10/616,895, filed Jul. 10, 2003.
Andrew W. Ott et al., "Forming a Dielectric Layer Using Porogens", U.S. Appl. No. 10/394,104, filed Mar. 21, 2003.
Grant M. Kloster et al., "Forming a Porous Dielectric Layer", U.S. Appl. No. 10/395,447, filed Mar. 24, 2003.
Grant M. Kloster et al., "Forming a Porous Dielectric Layer", U.S. Appl. No. 10/782,329, filed Feb. 19, 2004.
Michael D. Goodner, "UV-Activated Dielectric Layer", U.S. Appl. No. 10/403,532, filed Mar. 31, 2003.
Michael D. Goodner, "UV-Activated Dielectric Layer", U.S. Appl. No. 11/058,798, filed Feb. 15, 2005.

(Continued)

*Primary Examiner*—Michael Lebentritt
*Assistant Examiner*—Andre' Stevenson

(57) ABSTRACT

The invention provides a layer of photosensitive material that may be directly patterned. The photosensitive material may then be decomposed to leave voids or air gaps in the layer. This may provide a low dielectric constant layer with reduced resistance capacitance delay characteristics.

15 Claims, 7 Drawing Sheets

OTHER PUBLICATIONS

Robert P. Meagley et al., "Photoactive Resist Capping Layer", U.S. Appl. No. 10/927,885, filed Aug. 27, 2004.
Robert P. Meagley et al., "Removing Sacrificial Material by Thermal Decomposition", U.S. Appl. No. 10/953,744, filed Sep. 29, 2004.
Vijayakumar S. RamachandraRao et al., Post-Deposition Modification of Interlayer Dielectrics, U.S. Appl. No. 10/609,963, filed Jun. 30, 2003.
Robert P. Meagley, "Photoactive Adhesion Promoter", U.S. Appl. No. 10/288,021, filed Nov. 4, 2002.

* cited by examiner

PHOTOSENSITIVE DIELECTRIC LAYER

BACKGROUND

Background of the Invention

In a microelectronic structure, such as a substrate, conductors, such as vias and other conductors, are separated by dielectric materials. Low dielectric constant ("k value") materials are used as dielectrics between the conductors to reduce resistance capacitance ("RC") delay and improve device performance.

DETAILED DESCRIPTION

Figure 1:
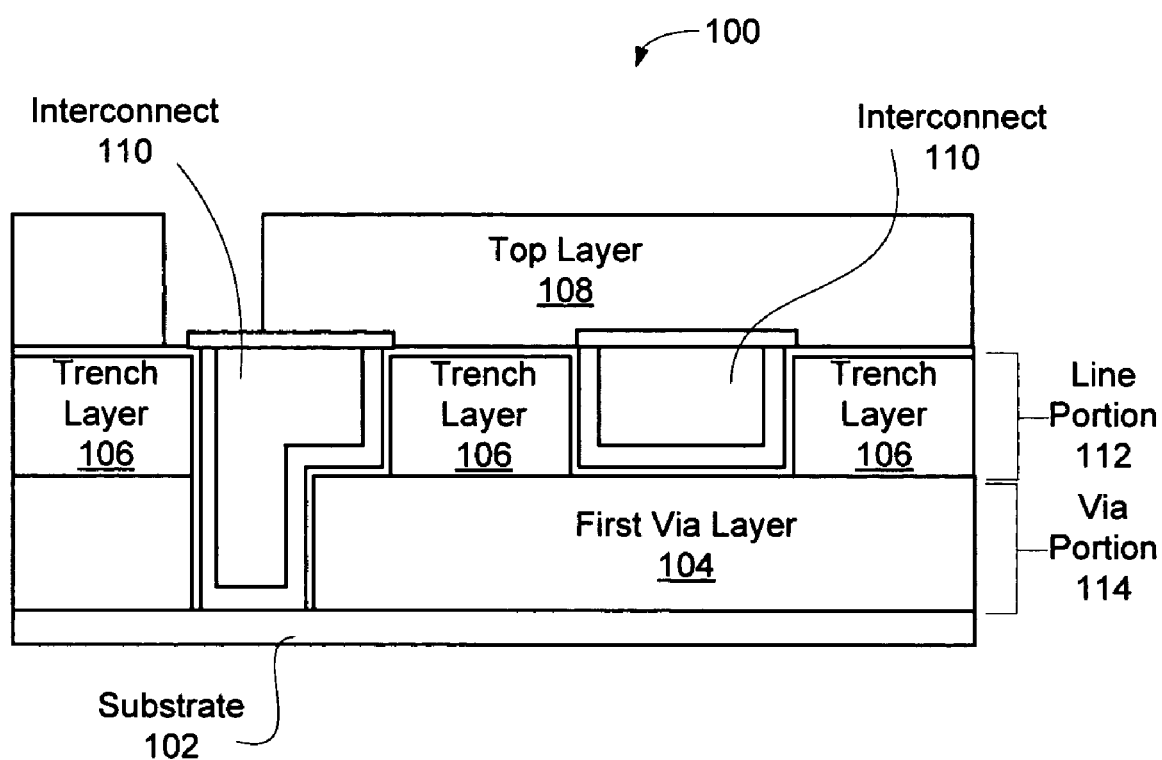
FIG. 1 is a cross sectional side view of a microelectronic structure according to one embodiment of the present invention.

FIG. 1 is a cross sectional side view of a microelectronic structure 100 according to one embodiment of the present invention. The microelectronic structure 100 may include a substrate 102 in one embodiment. The substrate 102 may be any surface generated, and may comprise, for example, active and passive devices that are formed on a silicon wafer, such as transistors, capacitors, resistors, local interconnects, and others. The substrate 102 may be a physical structure, a layer that is a basic workpiece transformed and/or added to by various processes into the desired microelectronic configuration, or another material or materials. The substrate 102 may include conducting material, insulating material, semiconducting material, and other materials or material combinations. In some embodiments, the substrate 102 may be a layered structure. The substrate 102 may add structural strength and rigidity to the assembly and facilitate electrical connection of the assembly 102 with an external component, such as a printed circuit board (not shown).

The structure 100 may include a first via layer 104. This first via layer 104 may comprise a dielectric material with a low dielectric constant (a low k value). The dielectric material of the first via layer 104 may comprise: silicon dioxide (either undoped or doped with phophorus or boron and phosphorus, or another dopant); silicon nitride; silicon oxy-nitride; porous oxide; an organic containing silicon oxide; a polymer; or another material. Suitable materials for the first via layer 104 also include but are not limited to siloxane-based polymers, such as those sold under the trade names "LKD-5109™", "Nanoglass E™", and "Zirkon™", distributed by JSR Microelectronics Corporation, Honeywell Corporation, and Shipley Corporation, respectively; fluorinated silicate glass ("FSG"); porous and nonporous carbon doped oxide ("CDO"), which may have the molecular structure $Si_xO_yR_z$, in which "R" is an alkyl or aryl group, where the CDO may comprise between about 5 and about 50 atom % carbon in some embodiments, and may comprise about 15 atom % carbon in some embodiments; a CVD-deposited CDO sold under the trade name "Black Diamond™", distributed by Applied Materials Corporation; silicon dioxide; a spin-on low-k silicon dioxide variant sold under the trade name "FOx™", distributed by Dow Corning Corporation; a CVD-deposited CDO sold under the trade name "Coral™", distributed by Novellus Corporation; electron-beam-cured CVD-deposited CDO materials; polyarylene-based dielectrics such as that sold under the trade name "SiLK™" and "GX-3™", distributed by Dow Chemical Corporation and Honeywell Corporation, respectively; poly(aryl ether)-based polymeric dielectrics such as that sold under the trade name "FLARE™", distributed by Honeywell Corporation; spin-on polymers such as polyimides, manufactured by several companies, or BCB-based materials, such as Cyclotene™, manufactured by Dow Chemical; materials known as "zeolites", such as highly-ordered mesoporous silica and aluminosilicate; or other materials.

The structure 100 may also include a trench layer 106. In some embodiments, the trench layer 106 may comprise a photosensitive material that has been partially or fully removed to leave behind voids or an air gap. The trench layer 106 may have originally comprised a photoresist material, a photosensitive dielectric material, or another material. After partial or full removal of the material, the trench layer 106 of the structure may comprise one or more air gaps, may comprise a matrix dielectric material with a plurality of voids or pores, or another material.

The structure 100 may also include a second via layer or a different type of layer as a top layer 108 above the trench layer 106. While the top layer 108 is described as a "top" layer and may be on top of the first via layer 104 and the trench layer 106, there may be additional layers above the top layer 108. In embodiments where the top layer 108 is a second via layer, the second via layer 106 may comprise a material substantially the same as the material of the first via layer 104, another material as described with respect to the first via layer 104 above, or a different material. In some embodiments, the top layer 108 may comprise a material that allows some or all of the material beneath to decompose and pass through, leaving the voids and/or air gaps of the trench layer 106. Thus, the top layer 108 may be a permeable layer through which decomposed portions of material may pass, leaving behind the trench layer 106. In some embodiments, the structure 100 may lack a top layer 108 above the trench layer 106.

The structure 100 may also include one or more interconnects 110. The interconnects 110 may comprise one or more vias and/or lines that may provide conductive electrical pathways for power, signals, or other electrical currents to travel. In the illustrated embodiment, the interconnects 110 may include smaller via portions 114 that extend through the first via layer 104, and larger line portions 112 that extend through the trench layer 106.

In the embodiment illustrated in FIG. 1, the first via layer 104 is positioned adjacent the via portion 114 of the interconnects 110 and not adjacent to the line portions 112. Such a geometric configuration may provide extra support to the narrowed via portion 114, which may be more susceptible to undesirable bending or deformation than the line portion 112 due to the via portion's 114 smaller relative size, while leaving the line portion 112 more likely surrounded by voids and/or air gaps of the trench layer 106. Additionally, the voids and/or air gaps of the trench layer 106 may decrease the k value of the trench layer 106 below that of the first via layer 104. Lower k values in the trench layer 106 than the first via layer 104 may reduce the RC delay in the line portion 112, where such delays may be more problematic than in the via portion 114. Thus, the structure 100 may provide more mechanical support to the via portion 114 that may be more susceptible to mechanical deformation than the line portion 112, and a lower k value material in the line portion 112 that may be more affected to RC delay than the via portion 114.

Figure 2:
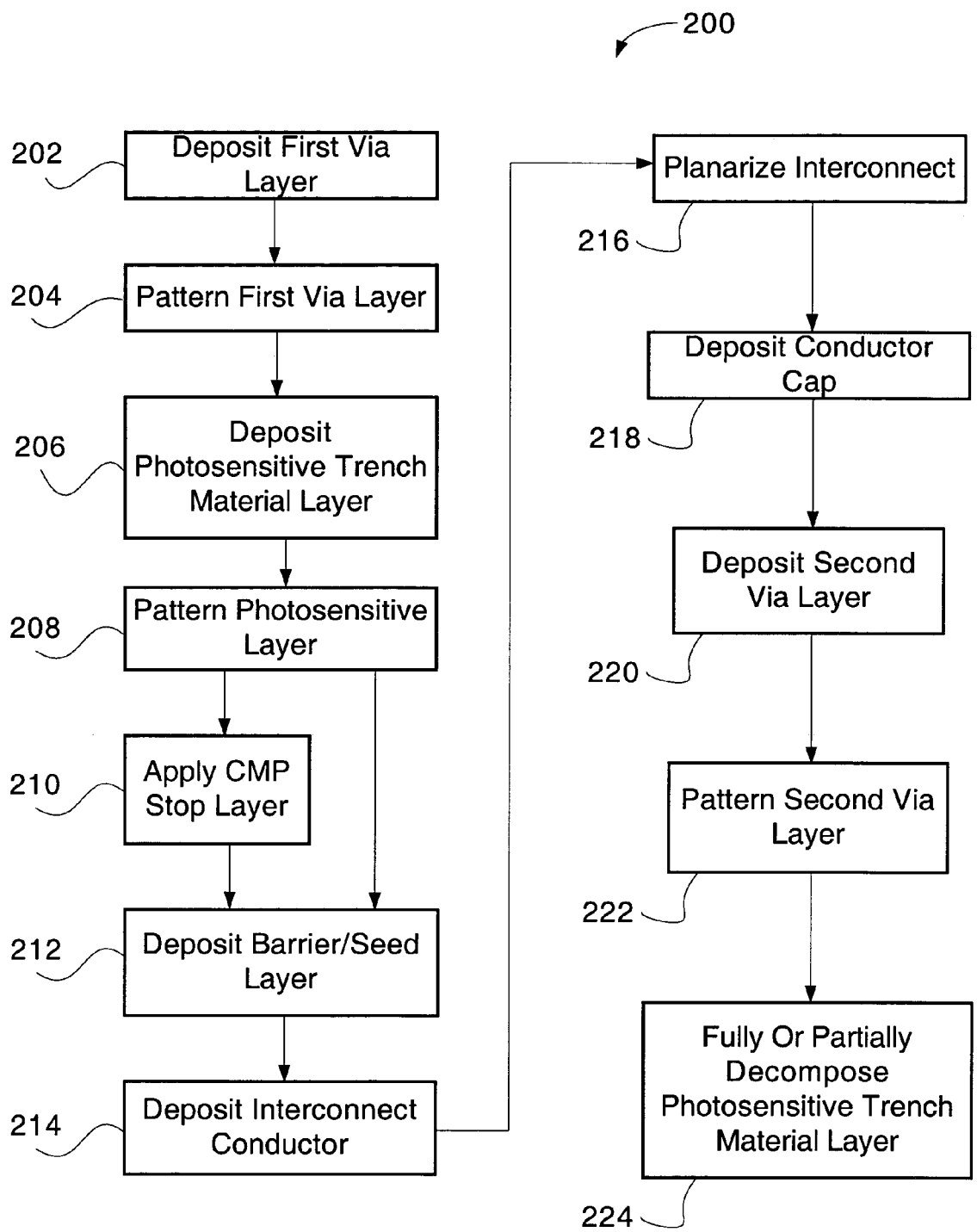
FIG. 2 is a flow chart that illustrates a method for fabricating a microelectronic structure.

FIG. 2 is a flow chart 200 that illustrates a method for fabricating a microelectronic structure, such as the microelectronic structure 100 of FIG. 1, according to one embodiment of the present invention. In other embodiments, some of the steps shown in the flow chart 200 may be omitted, other steps may be added, and/or the steps shown may be performed in a different order.

Figure 3:
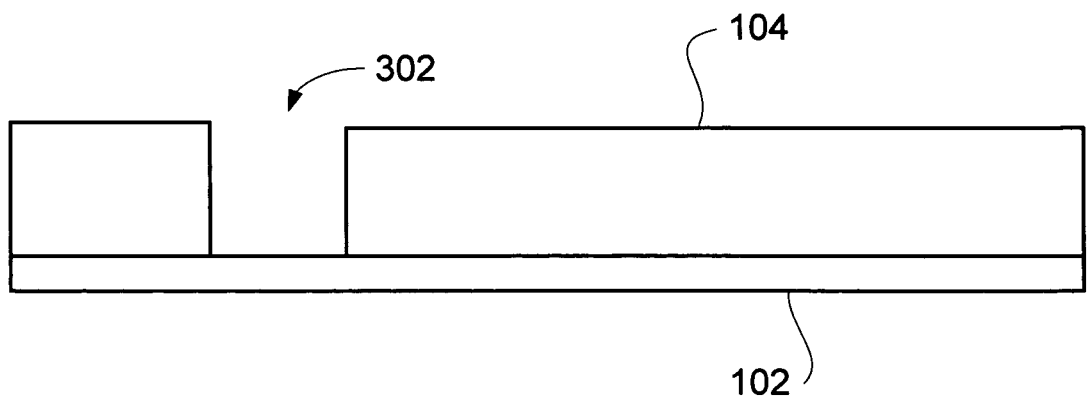
FIG. 3 is a cross sectional side view that illustrates a first via layer that has been deposited on a substrate.

The first via layer 104 may be deposited 202 on the substrate 102. In some embodiments, an anti-reflective coating may be first applied to the substrate 102 if the substrate 102 is reflective. As discussed above, the first via layer 104 may comprise a relatively robust dielectric material with a low k value. The dielectric material of the first via layer 104 may comprise a carbon doped oxide, silicon dioxide, or, as discussed above another material. The first via layer 104 may be patterned 204 to form via volumes in which the via portions 114 of interconnects 110 may be formed. FIG. 3 is a cross sectional side view that illustrates a first via layer 104 that has been deposited on a substrate 102 and been patterned to form a via volume 302 where the via portion 114 of an interconnect 110 may be formed.

Figure 4:
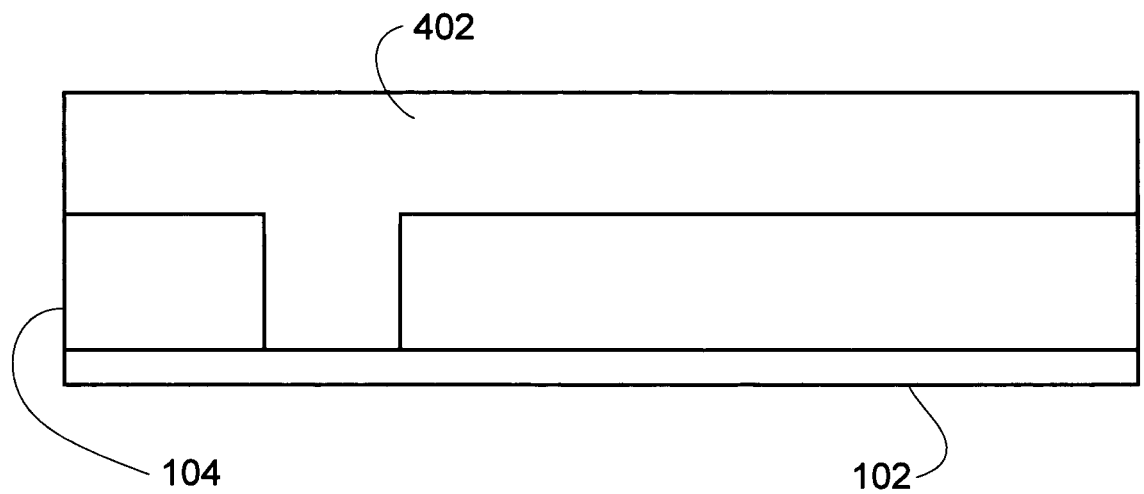
FIG. 4 is a cross sectional side view that illustrates a photosensitive trench material layer that has been deposited on the first via layer.

Returning to FIG. 2, a photosensitive trench material may then be applied 206. FIG. 4 is a cross sectional side view that illustrates a photosensitive trench material layer 402 that has been deposited on the first via layer 104. In some embodiments, the top of the photosensitive trench material layer 402 may be substantially planar. The photosensitive trench material layer 402 may be spun on to achieve a flat surface, or may be planarized after deposition. In some embodiments where an air gap trench layer 106 is desired so that the photosensitive trench material will be largely removed, a photoresist material or other photodefinable sacrificial dielectric material may be deposited as the photosensitive trench material layer 402. In some other embodiments where a plurality of voids in a matrix material is desired as the trench layer 106 rather than air gaps, a photosensitive porous dielectric matrix material with a decomposable porogen may be used. Suitable photosensitive trench materials for the photosensitive trench material layer 402, where the photosensitive trench material will be largely removed leaving one or more air gaps, include photoresist materials based on: polynorbornene polymers (commonly used in 193 nm lithography), fluorinated polymers (commonly used in 157 nm lithography), polyhydroxystyrene polymers (commonly used in 248 nm lithography), and other polymers which easily degrade at temperatures under 400 degrees Celsius. Suitable photosensitive dielectric materials include: Signiflow™ photodefinable low-k dielectric, manufactured by Clariant Corporation; porogen-containing polymer-based photosensitive dielectrics, such as porous, photosensitive polyimides; or other porogen-containing photosensitive dielectrics. Other materials may also be used.

Figure 5:
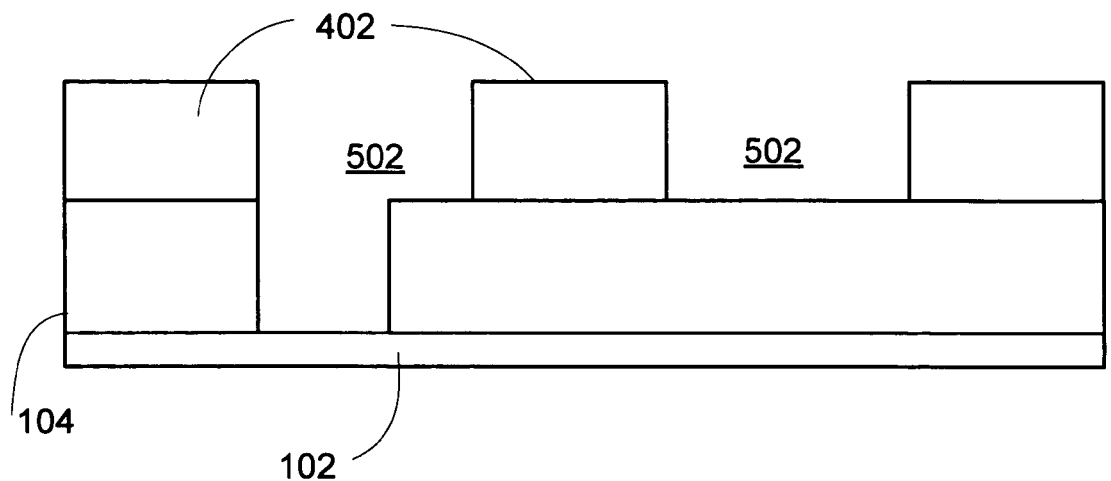
FIG. 5 is a cross sectional side view that illustrates a patterned photosensitive trench material layer.

Referring again to FIG. 2, the photosensitive trench material layer 402 may then be patterned 208 to form trenches in which the line portions 112 of the interconnects 110 may be formed. FIG. 5 is a cross sectional side view that illustrates a patterned 208 photosensitive trench material layer 402 with trenches 502 in which conductive material may be deposited to form line portions 112 of the interconnects 110.

In some embodiments, the photosensitive trench material layer 402 may be "directly patterned" rather than patterned by using a separate photoresist layer. Directly patterning the photosensitive trench material layer 402 means that no separate photoresist layer is used. The photosensitive trench material layer 402 itself is exposed to light and then the exposed portions of the photosensitive trench material layer 402 are removed (or the non-exposed portions are removed, depending on whether the material is positively or negatively photosensitive) to form the trenches 502, leaving the patterned 208 photosensitive trench material layer 402 with its trenches 502 behind. This may avoid problems that occur when patterning a dielectric layer using a separate photoresist layer and then trying to remove the remaining photoresist layer without damaging the dielectric layer. Since no separate photoresist layer or other layer need be stripped from the patterned 208 photosensitive trench material layer 402 after material is removed to form the trenches 502, damage to the photosensitive trench material layer 402 may be avoided. Furthermore, since no dry etching is needed to pattern layer 402 (beyond a descum step, as utilized by those skilled in the art), there is no need to develop complex chemistries to remove etch by-products (such as "sidewall polymer") without damaging the dielectric layer. Additionally, avoiding use of additional layers may reduce the processing cost, complexity and time of the structure 100. Use of a photosensitive material as the photosensitive trench material layer 402 may allow the simpler patterning method that does not require additional layers on the photosensitive trench material layer 402 in some embodiments. In some embodiments, no sacrificial light absorbing material (SLAM) layer or other anti-reflective layer is used in direct patterning of the photosensitive trench material layer 402, in addition to not using a separate photoresist layer.

As will be seen in the discussion below, additional layers and/or materials may be deposited on the patterned 208 photosensitive trench material layer 402. In some embodiments, the photosensitive trench material layer 402 may be patterned, and then the additional layers and/or materials deposited on top of the photosensitive trench material layer 402 without a photoresist strip step occurring after removing material from the photosensitive trench material layer 402 to form the trenches 502. For example, in embodiments where the photosensitive trench material layer 402 is directly patterned, no additional photoresist layer is used on top of the photosensitive trench material layer 402 in order to pattern the photosensitive trench material layer 402, so no photoresist strip step will occur between removal of material from the photosensitive trench material layer 402 to form the trenches 502 and depositing additional layers and/or materials on the patterned 208 photosensitive trench material layer 402.

Figure 6:
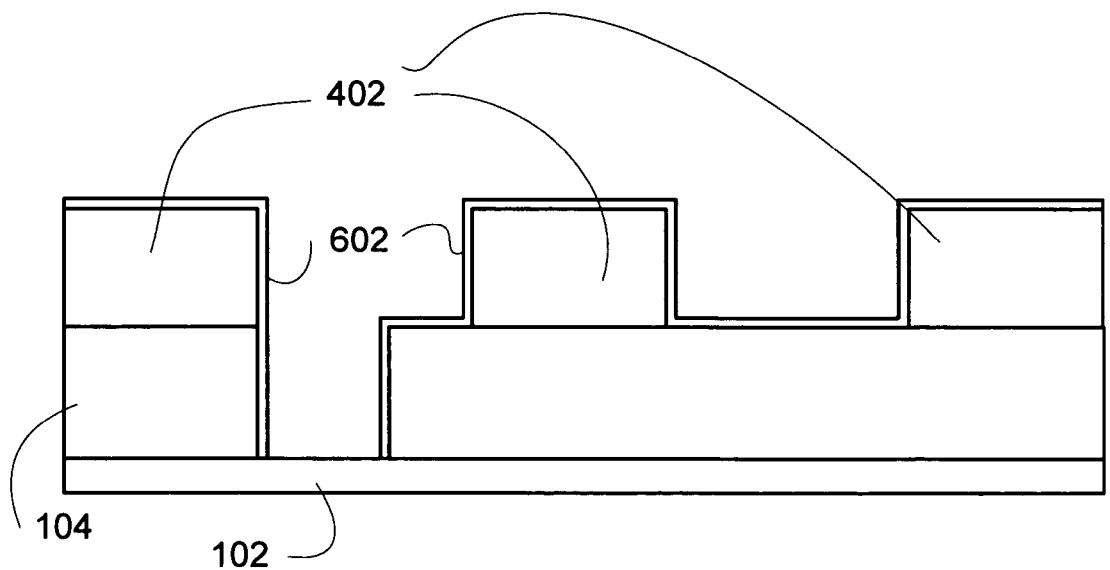
FIG. 6 is a cross sectional side view that illustrates a coating layer formed on the patterned photosensitive trench material layer.

Referring again to FIG. 2, a coating may be formed 210 at the surface of one or more of the patterned photosensitive trench material layer 402, the patterned first via layer 104, and the substrate 102. The coating formed 210 may deposited, may be formed by altering a thin layer of the photosensitive trench material layer 402, the patterned first via layer 104, or the substrate 102, or may be formed in other ways. FIG. 6 is a cross sectional side view that illustrates a coating layer 602 formed on the patterned photosensitive trench material layer 402 and the patterned first via layer 104. The coating 602 may act as a polish stop layer such as for later chemical mechanical polishing, may provide a smooth surface for deposition of further layers, or may serve other purposes.

In one embodiment, the coating layer 602 may be formed by electron beam (e-beam) curing the surface on which the coating layer is to be formed, which may toughen the surface to create the coating layer 602. In another embodiment, a method such as silica nanolaminate atomic layer deposition (ALD) may be used to grow the coating layer 602. In yet another embodiment, the coating layer 602 may be a polymer coating that is selectively deposited on the dielectrics 402 and 104, while not being deposited on the substrate 102. In other embodiments, resist coatings, such as inorganic conformal resist coatings or other coatings may be used. In yet other embodiments, other methods and coatings may be used, or no coating layer 602 may be used. In some embodiments in which a coating layer 602 is used, the coating layer may be permeable to allow decomposed portions of the photosensitive trench material layer 402 to pass, leaving behind the trench layer 106. In these embodiments, the coating layer 602 is formed selectively on dielectric layers 402 and 104, while not being formed on substrate 102, so that electrical connectivity may be maintained when the via portion (114 in FIG. 1) is filled in subsequent steps.

Figure 7:
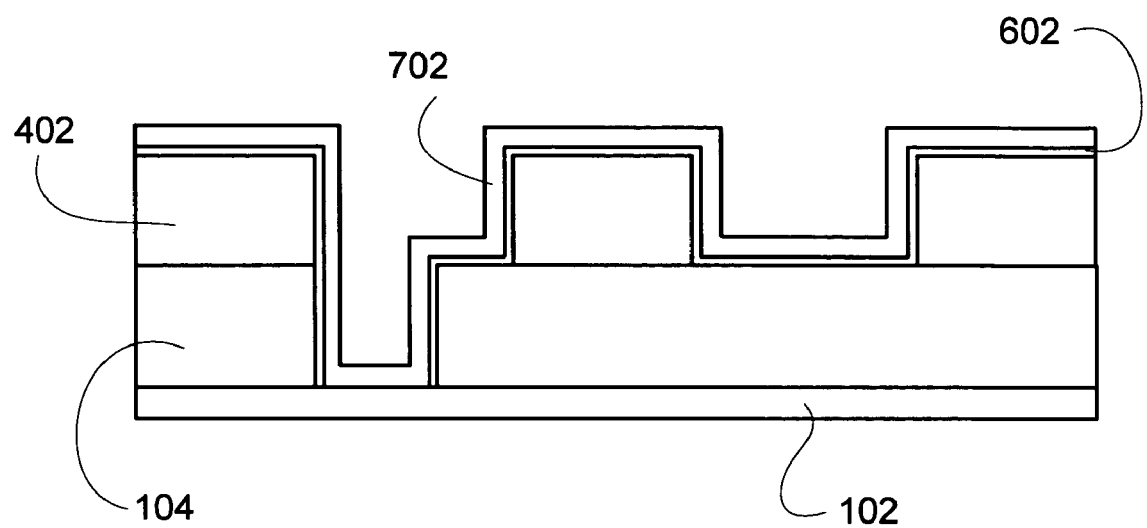
FIG. 7 is a cross sectional side view that illustrates a seed layer.

Returning again to FIG. 2, a seed layer may be deposited 212. FIG. 7 is a cross sectional side view that illustrates a seed layer 702 that has been deposited. In addition to or in place of the seed layer 702, a barrier layer and/or an adhesion layer may be deposited. Thus, while a single seed layer 702 is shown, the layer 702 may have more than one layer of material(s) and/or the material(s) may serve more than one purpose. In an embodiment, a barrier layer prevents interaction of layers deposited after the seed layer 702 from interacting with one or more of the photosensitive trench material layer 402, the trench layer 106, the first via layer 104, and the substrate 102. In an embodiment, an adhesion layer may be deposited to help the seed layer 702 and/or later deposited conductive material adhere to one or more of the photosensitive trench material layer 402, the trench layer 106, the first via layer 104, the substrate 102, and the barrier layer. There may be a seed layer 702 on top of the adhesion layer or barrier layer. The seed layer may comprise of one or more of Ni, NiV, Co, Cu, Au, Ag, Ta, TaN, Ti or other materials. In various embodiments, the seed layer 702 may be deposited by following a dual damascene process, and may be deposited by sputtering, physical vapor deposition ("PVD"), chemical vapor deposition ("CVD"), plasma enhanced chemical vapor deposition ("PECVD"), atomic layer deposition ("ALD"), electroless plating, or other methods or combinations of methods.

Figure 8:
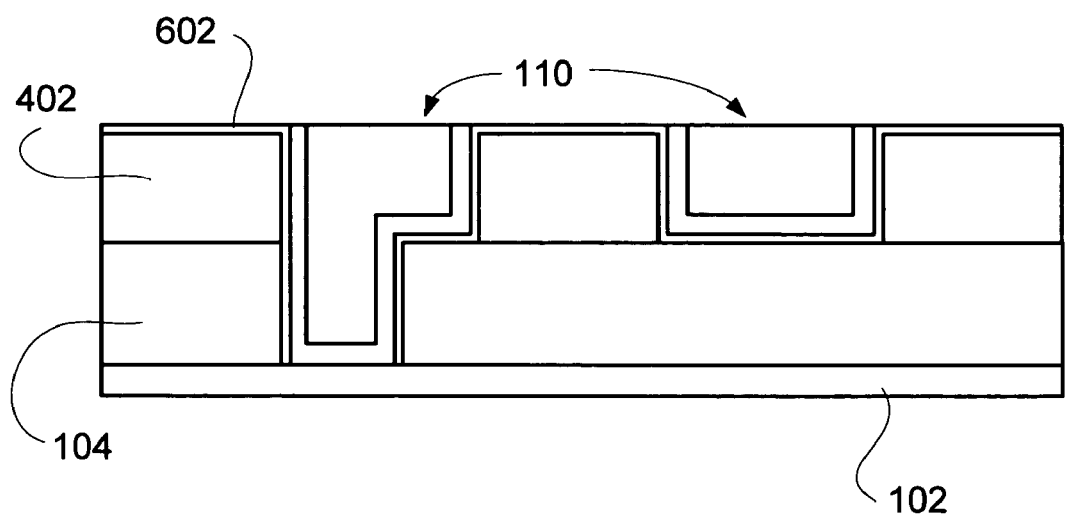
FIG. 8 is a cross sectional side view that illustrates the interconnects.

Referring now to FIG. 2, conductive material that may make up the bulk of the interconnects 110 may be deposited 214. The conductive material may comprise Cu, Al, Au, Ag, or other materials, and may be deposited 214 by methods such as electroplating or other methods. The deposited 214 conductive material may then be planarized 216, by chemical mechanical polishing ("CMP") or other methods to be substantially coplanar with the top of the photosensitive trench material layer 402 or the coating layer 602 and result in the interconnects 110. FIG. 8 is a cross sectional side view that illustrates the interconnects 110 after the deposited conductive material has been planarized 216. As can be appreciated from FIG. 8, each interconnect 110 may have one or both of a line portion 112 that extends through the first via layer 104 and a line portion 114 that extends through the photosensitive trench material layer 402. In an embodiment, the line portions 112 of the interconnects 110 are wider than the via portions 114 of the interconnects. In some embodiments, via diameters may range from 50 nm up to 1 micron, and the line portions may range in thickness from 100 nm to several microns.

Figure 9:
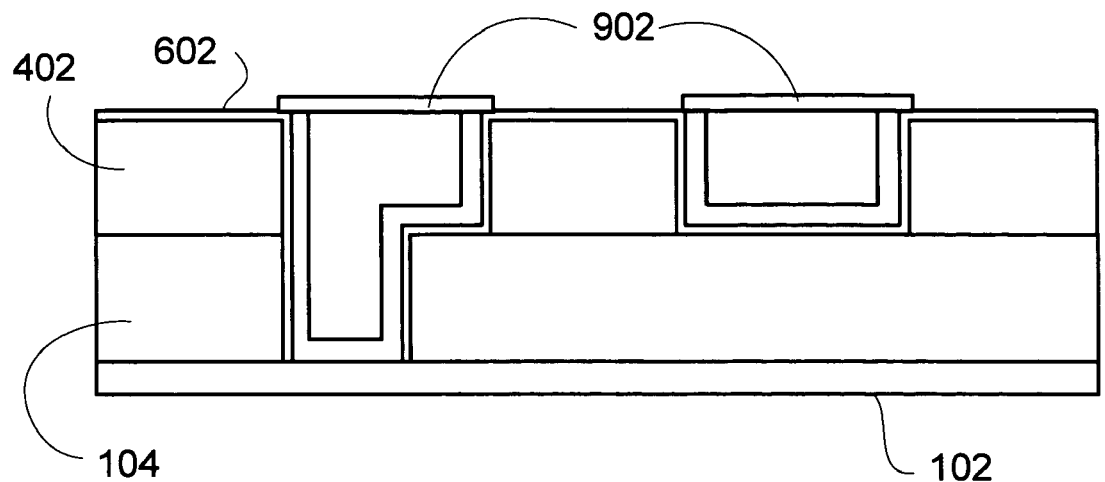
FIG. 9 is a cross sectional side view that illustrates caps deposited on the interconnects.

Referring again to FIG. 2, a cap or shunt may be deposited 218 on the planarized 216 interconnect 110 conductor. FIG. 9 is a cross sectional side view that illustrates caps 902 deposited 218 on the interconnects 110. The cap 902 may function to isolate the interconnect 110 from subsequent treatments and material layers, and prevent, for example, electromigration or diffusion. With copper metal conductive layers, a metal shunt layer comprising, for example, cobalt or tungsten, may be an effective cap 902 for isolating the copper interconnect 110. The shunt material may deposited using selective techniques such as electroless or flash deposition, at a thickness that may be in a range between about 5 nanometers and about 100 nanometers, in an embodiment.

Figure 10:
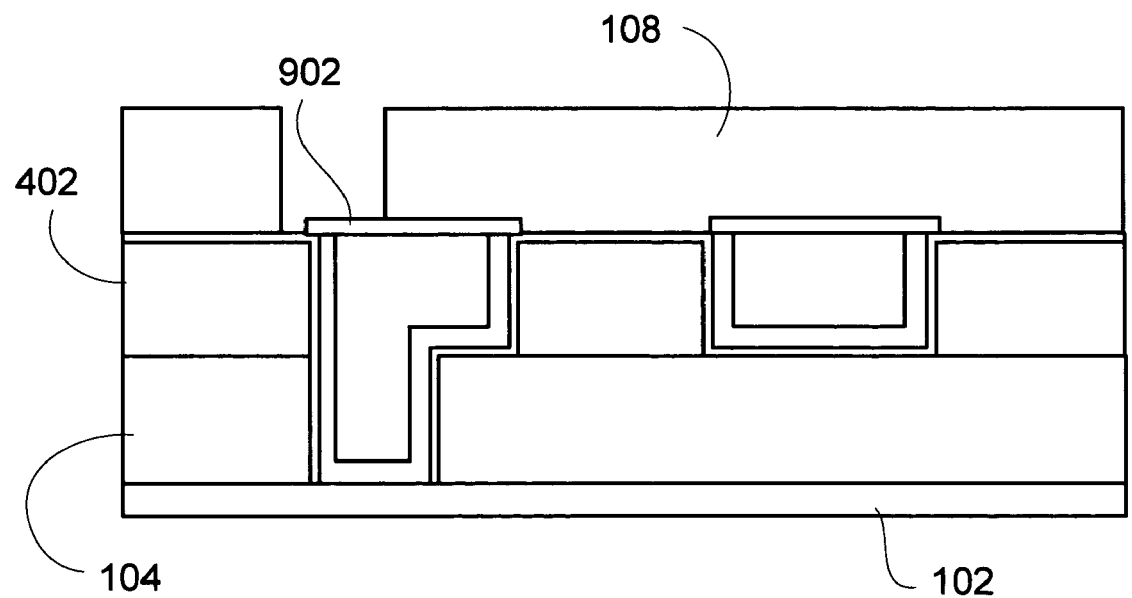
FIG. 10 is a cross sectional side view that illustrates the top layer.

Referring back to FIG. 2, a second via layer or other top layer 108 may then be deposited 220. As described above, the top layer 108 may be a second via layer that may comprise a material substantially the same as the material of the first via layer 104 or another material. The top layer 108 may also be a different layer that is not a second via layer. The top layer 108 may be a layer of permeable material through which decomposed portions of the photosensitive trench material layer 402 may pass, leaving behind the trench layer 106. In embodiments where the top layer 108 comprises a second via layer, the deposited second via layer may be patterned 222. FIG. 10 is a cross sectional side view that illustrates the top layer 108, in this case a patterned second via layer, deposited on the photosensitive trench material layer 402, interconnects 110, and caps 902. In some embodiments, the caps 902 may act as an etch stop layer when patterning a second via layer or other patterned layer. To support "unlanded vias" (a situation in which the via opening of layer 108 does not completely align with the top of the metal line in layer 402), the coating layer 602 may also act as an etch stop. The top layer 108, whether a second via layer or another type of layer may add structural support above the trench layer 106.

Figure 11:
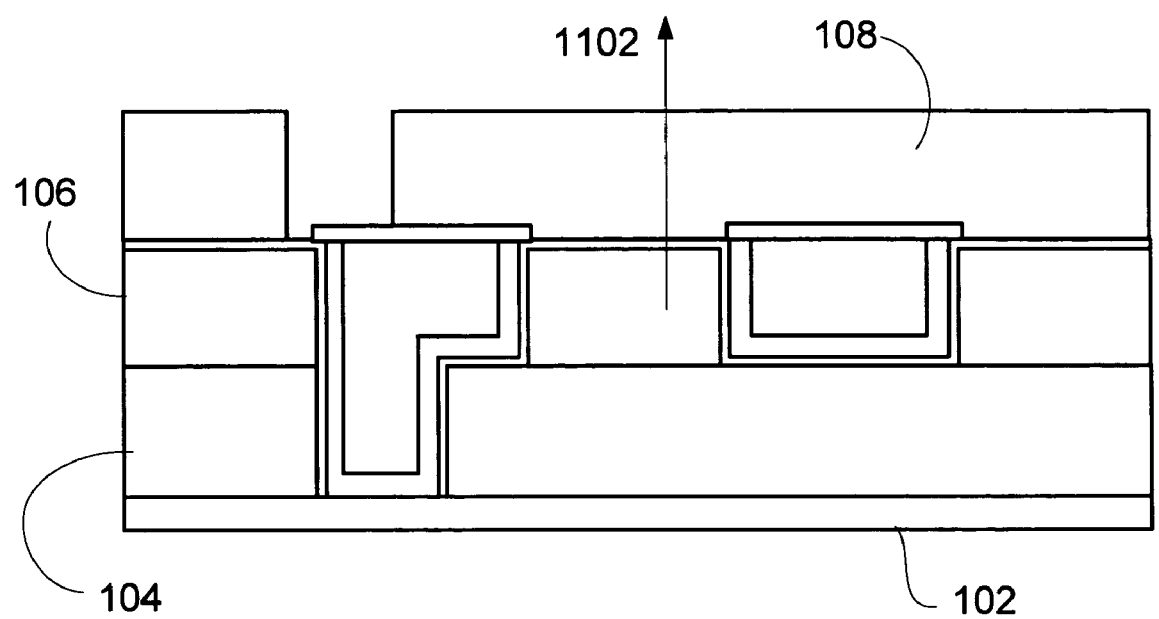
FIG. 11 is a cross sectional side view that illustrates the trench layer formed by decomposition of the photosensitive trench material layer.

Referring back to FIG. 2, photosensitive trench material layer 402 may be fully or partially decomposed 224 to result in the trench layer 106. Note that while the description refers to decomposition of the photosensitive trench material layer 402, only part of the photosensitive trench material layer 402 may be decomposed in some embodiments. For example, a porogen material found in pores of the photosensitive trench material layer 402 may be decomposed while the rest of the material may remain undecomposed. In other embodiments, a material may be partially decomposed leaving a partial remaining layer (which may be either porous or non-porous) which forms a partial air gap. FIG. 11 is a cross sectional side view that illustrates the trench layer 106 formed by decomposition of the photosensitive trench material layer 402. A transformation has occurred at the position previously occupied by the photosensitive trench material layer 402. At least a portion of the photosensitive trench material layer 402 has been decomposed as other surrounding layers are left substantially intact, to produce decomposition products (not shown), which have been removed by diffusion along a diffusion pathway 1102 through the top layer 108 and the coating layer 602. In other embodiments that differ, e.g. embodiments without a coating layer 602, the diffusion pathway 1102 will differ accordingly. The resulting structure 100, comprises one or more voids or air gaps in the volume previously occupied by the photosensitive trench material layer 402.

Given the variety of suitable materials, many pairings of top layer 108 and photosensitive trench material layer 402 may be successfully paired for selective decomposition and removal, depending upon the mode of decomposition, surrounding materials, and environmental limitations. Thermal and chemical modalities for facilitating selective decomposition and removal of material from the photosensitive trench material layer 402 may be used. In one embodiment, the material comprising the top layer 108 has a higher thermal decomposition temperature than the photosensitive trench material layer 402, in addition to a high glass transition temperature for thermo-mechanical stability. With such a pairing, the structure, or a portion thereof, may be heated to a temperature above the thermal decomposition temperature for the photosensitive trench material layer 402 which is below the thermal decomposition temperature for the top layer 108 and other surrounding structures, causing the photosensitive trench layer material 402 to decompose. In a chemical transformation embodiment, the photosensitive trench layer material 402 may be selectively decomposed by chemicals which do not substantially attack the top layer 108 and other adjacent materials, leaving the overall structure intact.

Thus, decomposition 224 of the photosensitive trench material layer 402 may be accomplished in some embodiments by heating the photosensitive trench material layer 402. In one embodiment, material from the photosensitive trench material layer 402 may be selectively decomposed and removed through the top layer 108 on the basis of differences in thermal decomposition temperatures between the material from the photosensitive trench material layer 402 and other surrounding materials. For example, in an embodiment where the photosensitive trench material layer 402 comprises a photoresist material, the photosensitive trench material layer 402 may be heated to a temperature in a range from about 180 degrees Celsius to about 400 degrees Celsius to decompose 224 the material. In another embodiment, the photosensitive trench material layer 402 may be heated to a temperature in a range from about 200 degrees Celsius to about 300 degrees Celsius. Similarly, in embodiments where the photosensitive trench material layer 402 comprises UNITY material, the photosensitive trench material layer 402 may be heated to a temperature in a range from about 250 degrees Celsius to about 400 degrees Celsius to decompose 224 the material. In embodiments where the photosensitive trench material layer 402 comprises a photosensitive matrix material with a porogen, the porogen may be thermally decomposed 224, leaving behind pores, or voids, in the matrix material. The decomposition may be removed by diffusion along a pathway 1102. In some embodiments where the pathway is less permeably to the decomposed materials, such as when a coating layer 602 forms a tighter seal, the photosensitive trench material layer 402 may be decomposed 224 more slowly, such as at a lower temperature, to avoid blistering or otherwise damaging the layers along the diffusion pathway 1102.

Following decomposition 224, further processing may be performed. For example, another layer of photosensitive trench material may be added and later transformed into a second trench layer. The resulting interconnect structure 100 may be used as a part of a microelectronic circuit, such as a substrate for a microprocessor die, where together the structure 100 and the microprocessor die comprise a microprocessor module.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

I claim:

1. A method, comprising:
   forming a first via dielectric layer on a substrate;
   patterning the first via dielectric layer to form a via through the first via dielectric layer;
   forming a photosensitive trench dielectric layer on the first via dielectric layer;
   patterning the photosensitive trench dielectric layer to form a trench through the photosensitive trench dielectric layer;
   depositing a conductive material in the via and the trench;
   forming a top layer on the photosensitive trench dielectric layer; and
   decomposing, at least partially, the photosensitive trench dielectric layer, decomposed material from the photosensitive trench dielectric layer passing through the top layer, wherein all the patterned first via dielectric layer remains in place after decomposing the photosensitive trench dielectric layer.

2. The method of claim 1, wherein decomposing the photosensitive trench dielectric layer comprises heating the photosensitive trench dielectric layer to a temperature in a range from about 180 degrees Celsius to about 400 degrees Celsius.

3. The method of claim 1, wherein patterning the photosensitive trench dielectric layer comprises directly patterning the photosensitive trench dielectric layer.

4. The method of claim 3, wherein patterning the photosensitive trench dielectric layer comprises patterning the photosensitive wench dielectric layer without using a separate photoresist layer on the photosensitive trench dielectric layer.

5. The method of claim 1, wherein the photosensitive trench dielectric layer is substantially completely decomposed, leaving an air gap between the first via dielectric layer and the top layer.

6. The method of claim 1, wherein the photosensitive trench dielectric layer is partially decomposed, leaving a partial air gap between the first via dielectric layer and the top layer.

7. The method of claim 1, wherein the photosensitive trench dielectric layer comprises a matrix material and porogen material, and decomposing the photosensitive trench dielectric layer comprises removing at least some of the porogen material from the matrix material, leaving a porous trench dielectric layer between the first via dielectric layer and the top layer.

8. The method of claim 1, wherein the photosensitive trench dielectric layer comprises at least one of a photoresist material, a photosensitive polynorbornene material, a photosensitive polysilazane material, a photosensitive benzocylcobirtene, a photosensitive polyarylene, a photosensitive polysiloxane, a photosensitive polybeozoxazole, a photosensitive polyborazylene, or a photosensitive fused ring polymer.

9. The method of claim 1, further comprising:
forming a coating layer on the patterned trench dielectric layer;
forming a conductor seed layer on the coating layer; and
forming a cap layer on the deposited conductive material in the via and the trench.

10. A method, comprising:
forming a first via dielectric layer on a substrate;
patterning the first via dielectric layer to form a via through the first via dielectric layer;
forming a first photosensitive trench dielectric layer on the first via dielectric layer directly patterning the photosensitive trench dielectric layer to form a trench through the photosensitive trench dielectric layer;
forming a second via dielectric layer on the first photosensitive trench dielectric layer;
decomposing, at least partially, the first photosensitive trench dielectric layer; and
wherein decomposing the first photosensitive trench dielectric layer occurs without removing the second via dielectric layer over at least some decomposed portions of the first photosensitive trench dielectric layer and without removing the first via dielectric layer under at least some decomposed portions of the first photosensitive trench dielectric layer.

11. The method of claim 10, wherein patterning the first photosensitive trench dielectric layer comprises patterning the first photosensitive trench dielectric layer without using an anti-reflective layer.

12. The method of claim 10, wherein the photosensitive trench dielectric layer comprises at least one of a photoresist material, a photosensitive polynorbornene material, a photosensitive polysilazane material, a photo sensitive benzocylcobutene, a photosensitive polyarylene, a photosensitive polysiloxane, a photosensitive polybenzoxazole, a photosensitive polyborazylene, or a photosensitive fused ring polymer.

13. The method of claim 10, further comprising:
patterning the second via dielectric layer to form a via through the second via dielectric layer;
forming a second photosensitive trench dielectric layer on the second via dielectric layer,
forming a top layer on the second photosensitive trench dielectric layer;
decomposing, at least partially, the second photosensitive trench dielectric layer; and
wherein after decomposing, at least partially, the first photosensitive trench dielectric layer and after decomposing, at least partially, the second photosensitive trench dielectric layer, portions of the second via dielectric layer remain between air gaps resulting from decomposition of portions of the first and second trench dielectric layers.

14. The method of claim 1, wherein the first via dialectic layer comprises a material that is not photosensitive.

15. The method of claim 1, wherein decomposed material from the photosensitive trench dielectric layer passing trough top layer comprises diffusion through portions of the top layer that have not been removed.

* * * * *